United States Patent
de Bock et al.

(10) Patent No.: US 10,130,968 B2
(45) Date of Patent: Nov. 20, 2018

(54) LOW RESONANCE ACOUSTIC SYNTHETIC JET STRUCTURE

(71) Applicant: General Electric Company, Schenectady, NY (US)

(72) Inventors: Hendrik Pieter Jacobus de Bock, Clifton Park, NY (US); Bryan Patrick Whalen, Gansevoort, NY (US); Stanton Earl Weaver, Broadalbin, NY (US); Charles Erklin Seeley, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 57 days.

(21) Appl. No.: 14/207,964

(22) Filed: Mar. 13, 2014

(65) Prior Publication Data
US 2014/0263728 A1    Sep. 18, 2014

Related U.S. Application Data

(60) Provisional application No. 61/784,216, filed on Mar. 14, 2013.

(51) Int. Cl.
*B05B 17/06* (2006.01)
*G06F 1/20* (2006.01)
(Continued)

(52) U.S. Cl.
CPC ........ *B05B 17/0615* (2013.01); *F04D 29/666* (2013.01); *F04D 33/00* (2013.01);
(Continued)

(58) Field of Classification Search
CPC .... B05B 17/06–17/0692; F04D 29/666; F04D 33/00; G06F 1/20; H01L 23/4336;
(Continued)

(56) References Cited

U.S. PATENT DOCUMENTS 6,394,363 B1 *  5/2002  Arnott ................. B41J 2/14201
                                                    239/102.1
6,722,581 B2    4/2004  Saddoughi
(Continued)

FOREIGN PATENT DOCUMENTS

CN    102884318 A    1/2013
JP    2004339939 A  12/2004
(Continued)

OTHER PUBLICATIONS

International Search Report and Written Opinion issued in connection with corresponding PCT Application No. PCT/US2014/025391 dated Jul. 8, 2014.
(Continued)

*Primary Examiner* — Alexander Valvis
*Assistant Examiner* — Cody Lieuwen
(74) *Attorney, Agent, or Firm* — Ziolkowski Patent Solutions Group, SC; Jean K. Testa

(57) ABSTRACT

A system and method for reducing or increasing the mechanical structure resonance of a synthetic jet device is disclosed. A synthetic jet device includes a first plate, a second plate spaced apart from the first plate, a spacing component coupled to and positioned between the first and second plates to form a chamber and including an orifice therein, and an actuator element coupled to at least one of the first and second plates to selectively cause deflection thereof, thereby changing a volume within the chamber so that a series of fluid vortices is generated and projected out from the orifice of the spacing component. At least one of the first and second plates includes a modified section that alters a mechanical resonance of the synthetic jet device, so as to control a level of acoustic noise generated by the synthetic jet device.

10 Claims, 7 Drawing Sheets

(51) Int. Cl.
*H01L 23/467* (2006.01)
*H05K 7/20* (2006.01)
*F04D 29/66* (2006.01)
*F04D 33/00* (2006.01)
*H01L 23/433* (2006.01)
*H01L 23/473* (2006.01)

(52) U.S. Cl.
CPC ............ *G06F 1/20* (2013.01); *H01L 23/4336* (2013.01); *H01L 23/467* (2013.01); *H01L 23/4735* (2013.01); *H05K 7/20172* (2013.01)

(58) Field of Classification Search
CPC .............. H01L 23/467; H01L 23/4735; H05K 7/20172
USPC ............................................ 239/102.1, 102.2
See application file for complete search history.

(56) References Cited

U.S. PATENT DOCUMENTS

| | | | |
|---|---|---|---|
| 7,204,615 | B2 | 4/2007 | Arik et al. |
| 7,387,491 | B2 | 6/2008 | Saddoughi et al. |
| 7,397,164 | B1 * | 7/2008 | Ali .......................... G06F 1/203 |
| | | | 310/311 |
| 7,543,961 | B2 | 6/2009 | Arik et al. |
| 7,556,406 | B2 | 7/2009 | Petroski et al. |
| 7,688,583 | B1 | 3/2010 | Arik et al. |
| 7,990,705 | B2 | 8/2011 | Bult et al. |
| 8,006,917 | B2 | 8/2011 | Arik et al. |
| 8,051,905 | B2 | 11/2011 | Arik et al. |
| 8,083,157 | B2 | 12/2011 | Arik et al. |
| 8,120,908 | B2 | 2/2012 | Arik et al. |
| 8,136,767 | B2 | 3/2012 | Cueman et al. |
| 8,308,078 | B2 | 11/2012 | Arik et al. |
| 8,342,819 | B2 | 1/2013 | Arik et al. |
| 8,418,934 | B2 | 4/2013 | Arik et al. |
| 8,434,906 | B2 | 5/2013 | Arik et al. |
| 8,453,715 | B2 | 6/2013 | Arik et al. |
| 8,496,049 | B2 | 7/2013 | Arik et al. |
| 8,529,097 | B2 | 9/2013 | Arik et al. |
| 8,564,217 | B2 | 10/2013 | Han et al. |
| 8,596,998 | B2 | 12/2013 | Fujisaki et al. |
| 8,602,607 | B2 | 12/2013 | Arik et al. |
| 2003/0017063 | A1 | 1/2003 | Komatsu et al. |
| 2005/0089415 | A1 | 4/2005 | Cho et al. |
| 2006/0237171 | A1 | 10/2006 | Mukasa et al. |
| 2008/0174620 | A1 * | 7/2008 | Tanner .................. B41J 2/14201 |
| | | | 347/10 |
| 2008/0197208 | A1 | 8/2008 | Taya et al. |
| 2009/0001194 | A1 | 1/2009 | Yen et al. |
| 2009/0108094 | A1 | 4/2009 | Ivri |
| 2009/0148320 | A1 | 6/2009 | Lucas |
| 2010/0045752 | A1 * | 2/2010 | Xu .......................... B64C 21/04 |
| | | | 347/68 |
| 2010/0051242 | A1 * | 3/2010 | Arik .......................... F15D 1/00 |
| | | | 165/104.33 |
| 2010/0054973 | A1 * | 3/2010 | Arik ...................... F04B 43/095 |
| | | | 417/437 |
| 2010/0060386 | A1 | 3/2010 | Belot et al. |
| 2010/0079943 | A1 | 4/2010 | Arik et al. |
| 2011/0076170 | A1 * | 3/2011 | Fujisaki ................ F04B 45/047 |
| | | | 417/415 |
| 2011/0114287 | A1 | 5/2011 | Arik et al. |
| 2011/0139429 | A1 | 6/2011 | Salapakkam et al. |
| 2011/0139893 | A1 * | 6/2011 | Wetzel ..................... F15D 1/00 |
| | | | 239/102.2 |
| 2011/0162823 | A1 | 7/2011 | Sharma et al. |
| 2011/0169374 | A1 | 7/2011 | Engel et al. |
| 2011/0174462 | A1 | 7/2011 | Arik et al. |
| 2012/0018537 | A1 | 1/2012 | Arik et al. |
| 2012/0097377 | A1 | 4/2012 | Arik et al. |
| 2012/0170216 | A1 | 7/2012 | Arik et al. |
| 2013/0213618 | A1 | 8/2013 | Arik et al. |
| 2013/0230934 | A1 | 9/2013 | Arik et al. |
| 2013/0264909 | A1 | 10/2013 | Glaser et al. |
| 2013/0336035 | A1 | 12/2013 | Ramabhadran et al. |
| 2014/0034270 | A1 | 2/2014 | de Bock et al. |
| 2014/0049970 | A1 | 2/2014 | de Bock et al. |

FOREIGN PATENT DOCUMENTS

| | | |
|---|---|---|
| JP | 2006297295 A | 11/2006 |
| JP | 2008014148 A | 1/2008 |
| JP | 2012528980 A | 11/2012 |
| KR | 1020130020747 A | 2/2013 |
| TW | I342364 B | 5/2011 |
| WO | 2010139916 A1 | 12/2010 |

OTHER PUBLICATIONS

Glezer et al., "Synthetic Jets", Annual Review of Fluid Mechanics, Annual Reviews, A Nonprofit Scientific Publisher, vol. 34, Jan. 2002, pp. 503-529.

Lee et al., "A piezoelectrically actuated micro synthetic jet for active flow control", Sensors and Actuators A: Physical, ScienceDirect, vol. 108, Issues 1-3, Nov. 15, 2003, pp. 168-174.

Unofficial English translation of Office Action issued in connection with corresponding CN Application No. 201480015354.1 dated Aug. 25, 2016.

Machine Translation and copy of Japanese Office Action issued in connection with corresponding JP Application No. 2016501843 dated Mar. 6, 2018.

Unofficial English Translation of Taiwan Notice of Allowance issued in connection with corresponding TW Application No. 103109236 dated Mar. 7, 2018.

* cited by examiner

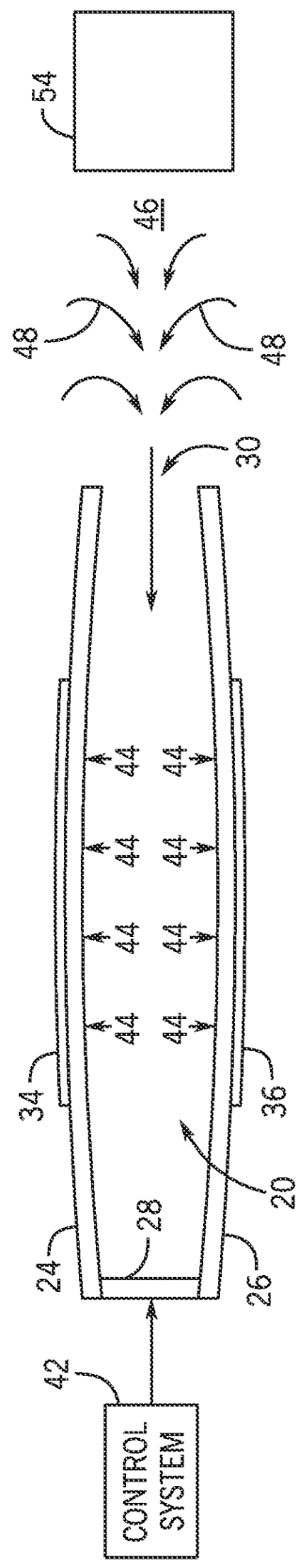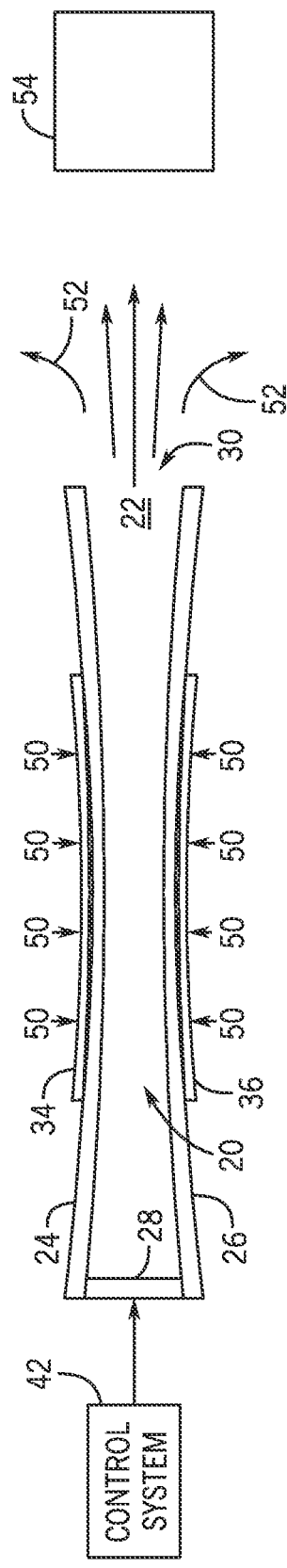

LOW RESONANCE ACOUSTIC SYNTHETIC JET STRUCTURE

CROSS-REFERENCE TO RELATED APPLICATION

The present application is a non-provisional of, and claims priority to, U.S. Provisional Patent Application Ser. No. 61/784,216, filed Mar. 14, 2013, the disclosure of which is incorporated herein by reference.

BACKGROUND OF THE INVENTION

Synthetic jet actuators are a widely-used technology that generates a synthetic jet of fluid to influence the flow of that fluid over a surface to disperse heat away therefrom. A typical synthetic jet actuator comprises a housing defining an internal chamber. An orifice is present in a wall of the housing. The actuator further includes a mechanism in or about the housing for periodically changing the volume within the internal chamber so that a series of fluid vortices are generated and projected in an external environment out from the orifice of the housing. Examples of volume changing mechanisms may include, for example, a piston positioned in the jet housing to move fluid in and out of the orifice during reciprocation of the piston or a flexible diaphragm as a wall of the housing. The flexible diaphragm is typically actuated by a piezoelectric actuator or other appropriate means.

Typically, a control system is used to create time-harmonic motion of the volume changing mechanism. As the mechanism decreases the chamber volume, fluid is ejected from the chamber through the orifice. As the fluid passes through the orifice, sharp edges of the orifice separate the flow to create vortex sheets that roll up into vortices. These vortices move away from the edges of the orifice under their own self-induced velocity. As the mechanism increases the chamber volume, ambient fluid is drawn into the chamber from large distances from the orifice. Since the vortices have already moved away from the edges of the orifice, they are not affected by the ambient fluid entering into the chamber. As the vortices travel away from the orifice, they synthesize a jet of fluid, i.e., a "synthetic jet."

A drawback of existing synthetic jet designs is the noise generated from operation of the synthetic jet. Audible noise is inherent in the operation of synthetic jets as a result of the flexible diaphragm being caused to deflect in an alternating motion, and the natural frequencies of the synthetic jet's various operational modes (structural/mechanical, disk-bending, and acoustic) impact the amount of noise generated during operation.

In operation, synthetic jets are typically excited at or near their mechanical resonance mode(s) in order to optimize electrical to mechanical conversion and so as to achieve maximum deflection at minimal mechanical energy input. While synthetic jet operation is optimized when operated at or near their mechanical resonance mode(s), it is recognized that operating the synthetic jet at certain frequencies can generate a substantial amount of acoustic noise, as the acoustic signature of the device is in part determined by the drive frequency of the device. Typical synthetic jet resonance is in the 100-170 Hz range; however, it is recognized that such a resonance range is within the hearing range of individuals, and thus the operation of the synthetic jet at the resonance frequency generates audible acoustic noise.

It would therefore be desirable to provide a synthetic jet having a mechanical resonance below or above the human receptive band (i.e., hearing range), such as below 30 Hz or above 20 kHz, so as to reduce the acoustic signature of the synthetic jet while not affecting the flow output of the device.

BRIEF DESCRIPTION OF THE INVENTION

According to one aspect of the invention, a synthetic jet device includes a first plate, a second plate spaced apart from the first plate, a spacing component coupled to and positioned between the first and second plates to form a chamber and including an orifice therein, and an actuator element coupled to at least one of the first and second plates to selectively cause deflection thereof, thereby changing a volume within the chamber so that a series of fluid vortices is generated and projected out from the orifice of the spacing component, wherein at least one of the first and second plates includes a modified section that alters a mechanical resonance of the synthetic jet device, so as to control a level of acoustic noise generated by the synthetic jet device.

In accordance with another aspect of the invention, a synthetic jet device includes a first plate, a second plate spaced apart from the first plate, a spacing component coupled to and positioned between the first and second plates to form a chamber and including an orifice therein, and an actuator element coupled to at least one of the first and second plates to selectively cause deflection thereof, thereby changing a volume within the chamber so that a series of fluid vortices is generated and projected out from the orifice of the spacing component, wherein at least one of the actuator element, the first plates, and the second plate is constructed to cause a mechanical resonance of the synthetic jet device during operation to be outside of a human audible frequency range.

In accordance with yet another aspect of the invention, a synthetic jet device includes a first plate, a second plate spaced apart from the first plate, a spacing component coupled to and positioned between the first and second plates to form a chamber and including an orifice therein, and a piezomotive actuator coupled to at least one of the first and second plates to selectively cause deflection thereof, thereby changing a volume within the chamber so that a fluid flow is generated and projected from the orifice of the spacing component, wherein the piezomotive actuator is constructed to cause the synthetic jet device to operate within a desired mechanical resonance range that is predetermined.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIG. 3 is a cross-section of the synthetic jet of FIG. 2 depicting the jet as the control system causes the diaphragms to travel inward, toward the orifice.

FIG. 4 is a cross-section of the synthetic jet actuator of FIG. 2 depicting the jet as the control system causes the diaphragms to travel outward, away from the orifice.

DESCRIPTION OF THE INVENTION

Embodiments of the invention are directed to an apparatus and method for reducing or increasing the mechanical structure resonance of a synthetic jet device.

FIGS. 1-4 illustrate a general structure of a synthetic jet assembly 10 useable with embodiments of the present invention, along with the movement of various components during operation thereof, for purposes of better understanding the invention. While a specific synthetic jet assembly 10 is illustrated in FIGS. 1-4, it is recognized that embodiments of the invention may be incorporated into synthetic jet assemblies of varied constructions, and thus the synthetic jet assembly 10 is not meant to limit the scope of the invention. As an example, synthetic jet assemblies that do not include a mounting bracket for securing positioning a synthetic jet are considered to be within the scope of the invention.

Figure 1:
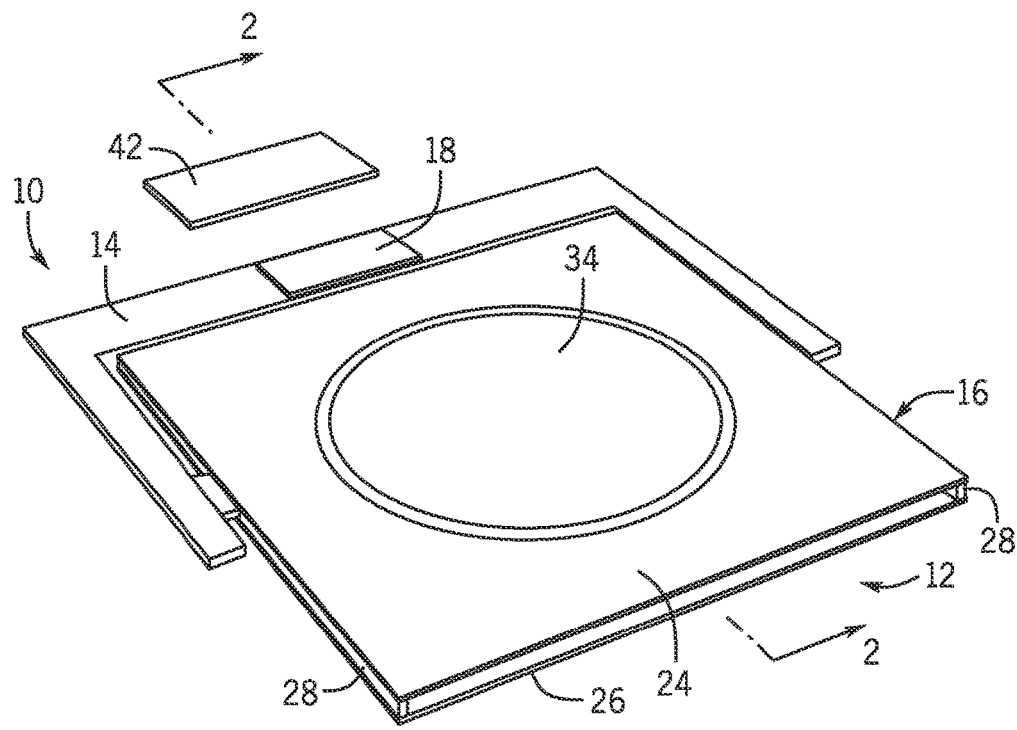
FIG. 1 is a perspective view of a synthetic jet assembly useable with embodiments of the invention.
Figure 2:
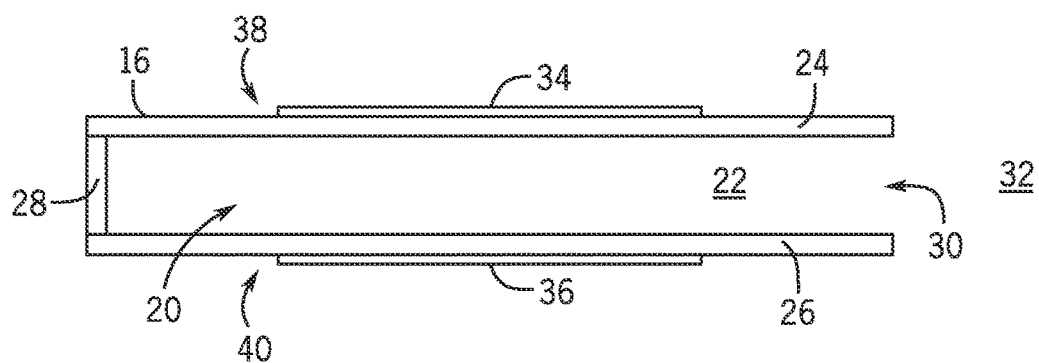
FIG. 2 is a cross-section of a portion of a synthetic jet useable with embodiments of the invention.

Referring first to FIG. 1, the synthetic jet assembly 10 is shown as including a synthetic jet 12, a cross-section of which is illustrated in FIG. 2, and a mounting bracket 14. In one embodiment, mounting bracket 14 is a u-shaped mounting bracket that is affixed to a body or housing 16 of synthetic jet 12 at one or more locations, although it is recognized that the mounting bracket may be constructed as a bracket having a different shape/profile, such as a semi-circular bracket configured to receive a circular synthetic jet 12 therein. A circuit driver 18 can be externally located or affixed to mounting bracket 14. Alternatively, circuit driver 18 may be remotely located from synthetic jet assembly 10.

Referring now to FIGS. 1 and 2 together, and as shown therein, housing 16 of synthetic jet 12 defines and partially encloses an internal chamber or cavity 20 having a gas or fluid 22 therein. While housing 16 and internal chamber 20 can take virtually any geometric configuration according to various embodiments of the invention, for purposes of discussion and understanding, housing 16 is shown in cross-section in FIG. 2 as including a first plate 24 and a second plate 26 (alternately referred to as blades or foils), which are maintained in a spaced apart relationship by a spacer element 28 positioned therebetween. In one embodiment, spacer element 28 maintains a separation of approximately 1 mm between first and second plates 24, 26. One or more orifices 30 are formed between first and second plates 24, 26 and the side walls of spacer element 28 in order to place the internal chamber 20 in fluid communication with a surrounding, exterior environment 32. In an alternative embodiment, spacer element 28 includes a front surface (not shown) in which one or more orifices 30 are formed.

According to various embodiments, first and second plates 24, 26 may be formed from a metal, plastic, glass, and/or ceramic. Likewise, spacer element 28 may be formed from a metal, plastic, glass, and/or ceramic. Suitable metals include materials such as nickel, aluminum, copper, and molybdenum, or alloys such as stainless steel, brass, bronze, and the like. Suitable polymers and plastics include thermoplastics such as polyolefins, polycarbonate, thermosets, epoxies, urethanes, acrylics, silicones, polyimides, and photoresist-capable materials, and other resilient plastics. Suitable ceramics include, for example, titanates (such as lanthanum titanate, bismuth titanate, and lead zirconate titanate) and molybdates. Furthermore, various other components of synthetic jet 12 may be formed from metal as well.

Actuators 34, 36 are coupled to respective first and second plates, 24, 26 to form first and second composite structures or flexible diaphragms 38, 40, which are controlled by driver 18 via a controller assembly or control unit system 42. For example, each flexible diaphragm 38, 40 may be equipped with a metal layer and a metal electrode may be disposed adjacent to the metal layer so that diaphragms 38, 40 may be moved via an electrical bias imposed between the electrode and the metal layer. As shown in FIG. 1, in one embodiment controller assembly 42 is electronically coupled to driver 18, which is coupled directly to mounting bracket 14 of synthetic jet 12. In an alternative embodiment control unit system 42 is integrated into a driver 18 that is remotely located from synthetic jet 12. Moreover, control system 42 may be configured to generate the electrical bias by any suitable device, such as, for example, a computer, logic processor, or signal generator.

In one embodiment, actuators 34, 36 are piezoelectric motive (piezomotive) devices that may be actuated by application of a harmonic alternating voltage that causes the piezomotive devices to rapidly expand and contract. During operation, control system 42 transmits an electric charge, via driver 18, to piezoelectric actuators 34, 36, which undergo mechanical stress and/or strain responsive to the charge. The stress/strain of piezomotive actuators 34, 36 causes deflection of respective first and second plates 24, 26 such that a time-harmonic or periodic motion is achieved that changes the volume of the internal chamber 20 between plates 24, 26. According to one embodiment, spacer element 28 can also be made flexible and deform to change the volume of internal chamber 20. The resulting volume change in internal chamber 20 causes an interchange of gas or other fluid between internal chamber 20 and exterior volume 32, as described in detail with respect to FIGS. 3 and 4.

Piezomotive actuators 34, 36 may be monomorph or bimorph devices, according to various embodiments of the invention. In a monomorph embodiment, piezomotive actuators 34, 36 may be coupled to plates 24, 26 formed from materials including metal, plastic, glass, or ceramic. In a bimorph embodiment, one or both piezomotive actuators 34, 36 may be bimorph actuators coupled to plates 24, 26 formed from piezoelectric materials. In an alternate embodiment, the bimorph may include single actuators 34, 36, and plates 24, 26 are the second actuators.

The components of synthetic jet 12 may be adhered together or otherwise attached to one another using adhesives, solders, and the like. In one embodiment, a thermoset adhesive or an electrically conductive adhesive is employed to bond actuators 34, 36 to first and second plates, 24, 26 to form first and second composite structures 38, 40. In the case of an electrically conductive adhesive, an adhesive may be filled with an electrically conductive filler such as silver, gold, and the like, in order to attach lead wires (not shown) to synthetic jet 12. Suitable adhesives may have a hardness in the range of Shore A hardness of 100 or less and may include as examples silicones, polyurethanes, thermoplastic rubbers, and the like, such that an operating temperature of 120 degrees or greater may be achieved.

In an embodiment of the invention, actuators 34, 36 may include devices other than piezoelectric motive devices, such as hydraulic, pneumatic, magnetic, electrostatic, and ultrasonic materials. Thus, in such embodiments, control system 42 is configured to activate respective actuators 34, 36 in corresponding fashion. For example, if electrostatic materials are used, control system 42 may be configured to provide a rapidly alternating electrostatic voltage to actuators 34, 36 in order to activate and flex respective first and second plates 24, 26.

The operation of synthetic jet 12 is described with reference to FIGS. 3 and 4. Referring first to FIG. 3, synthetic jet 12 is illustrated as actuators 34, 36 are controlled to cause first and second plates 24, 26 to move outward with respect to internal chamber 20, as depicted by arrows 44. As first and second plates 24, 26 flex outward, the internal volume of internal chamber 20 increases, and ambient fluid or gas 46 rushes into internal chamber 20 as depicted by the set of arrows 48. Actuators 34, 36 are controlled by control system 42 so that when first and second plates 24, 26 move outward from internal chamber 20, vortices are already removed from edges of orifice 30 and thus are not affected by the ambient fluid 46 being drawn into internal chamber 20. Meanwhile, a jet of ambient fluid 46 is synthesized by vortices creating strong entrainment of ambient fluid 46 drawn from large distances away from orifice 30.

FIG. 4 depicts synthetic jet 12 as actuators 34, 36 are controlled to cause first and second plates 24, 26 to flex inward into internal chamber 20, as depicted by arrows 50. The internal volume of internal chamber 20 decreases, and fluid 22 is ejected as a cooling jet through orifice 30 in the direction indicated by the set of arrows 52 toward a device 54 to be cooled, such as, for example a light emitting diode. As the fluid 22 exits internal chamber 20 through orifice 30, the flow separates at the sharp edges of orifice 30 and creates vortex sheets which roll into vortices and begin to move away from edges of orifice 30.

While the synthetic jet of FIGS. 1-4 is shown and described as having a single orifice therein, it is also envisioned that embodiments of the invention may include multiple orifice synthetic jet actuators. Additionally, while the synthetic jet actuators of FIGS. 1-4 are shown and described as having an actuator element included on each of first and second plates, it is also envisioned that embodiments of the invention may include only a single actuator element positioned on one of the plates. Furthermore, it is also envisioned that the synthetic jet plates may be provided in a circular, rectangular, or alternatively shaped configuration, rather than in a square configuration as illustrated herein.

According to one embodiment of the invention, in order to reduce or increase the mechanical structure resonance of a synthetic jet device—including varying the range of motion of the plates 24, 26 and/or the frequency of the synthetic jet 12—the piezo-actuator devices 34, 36 mounted on the plates 24, 26 are selectively varied in size, shape, placement location, and/or number. That is, a size, shape, placement location, and/or number of a piezo-actuators 34, 36 included in the synthetic jet 12 can be varied as compared to the "standard" actuators 34, 36 shown in FIGS. 1-4—i.e., actuators 34, 36 having a standard size and placement location on plates 24, 26. The alternate placement, sizing and shaping of the piezo-actuators 34, 36 mounted on the plates 24, 26 can be selected based on desired or preferred operating conditions of the synthetic jet 12. For example, select modal shapes of the synthetic jet 12 (i.e., of the moving components therein) may be preferred over others such that they provide significant flow output for the synthetic jet assembly 10 and/or frequency characteristics and/ or audio output (e.g., from none, or little, to desired output in the human discernible range).

Various embodiments of the invention regarding the size, shape and/or number of piezo-actuator device(s) on the plates 24, 26 are shown in FIGS. 5-9. These embodiments represent some examples, but are merely exemplary of the concepts embodied in each.

Figure 5:
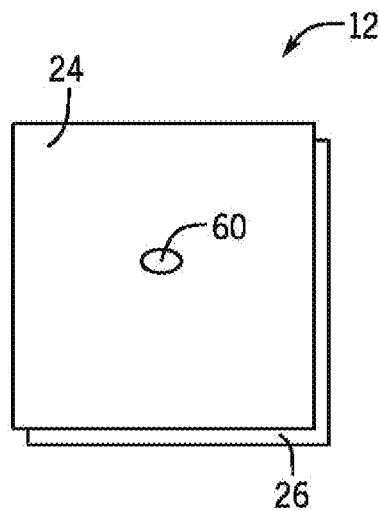
FIG. 5 is a top view of a synthetic jet according to an embodiment of the invention.

Referring first to FIG. 5, according to one embodiment, the size of a piezo-actuator 60 in synthetic jet 12 is minimized as compared to the "standard" actuators 34, 36 shown in FIGS. 1-4. As the piezo-actuator 60 merely serves to excite the plates 24, 26 at the resonance frequency and does not have to do much actual work, the size of the piezo-actuator 60 can be reduced without negatively impacting the operation and flow output of the synthetic jet 12. As the smaller piezo-actuator 60 has a reduced size, the actuator has less stiffness and thus provides a lower resonance so as to lower acoustic levels of the synthetic jet 12 during operation.

Figure 6A:
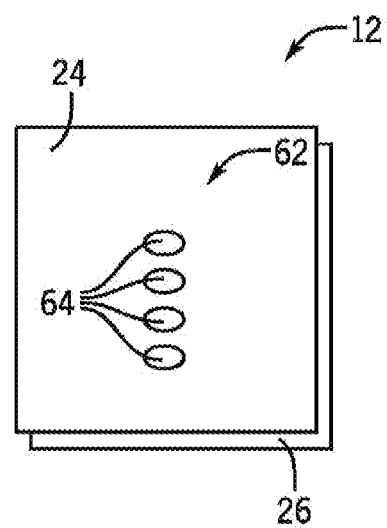
FIGS. 6A and 6B are top views of a synthetic jet according to embodiments of the invention.
Figure 6B:
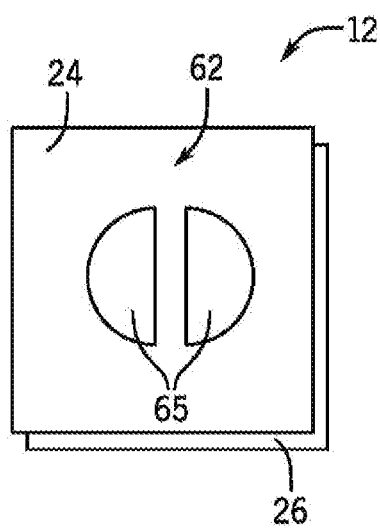

Referring next to FIGS. 6A and 6B, according to another embodiment, a segmented piezo-actuator 62 is employed on each plate 24, 26 instead of the single "standard" actuator 34, 36 shown in FIGS. 1-4. In one embodiment, and as shown in FIG. 6A, the segmented piezo-actuator 62 may be constructed as a "chain" of smaller piezo-actuators 64 that are placed on the plates 24, 26 in any of a number of desired arrangements or patterns based on desired or preferred operating conditions of the synthetic jet 12 (e.g., a desired modal shape of the moving components of the synthetic jet 12). In another embodiment, and as shown in FIG. 6B, the segmented piezo-actuator 62 may be constructed as a split-circle piezo-actuator formed of two halves 65. The specific arrangement and placement of the segmented piezo-actuator 62 serves to minimize stiffness of the synthetic jet 12 in one direction, and thus provides a lower resonance so as to lower acoustic levels of the synthetic jet 12 during operation.

Figure 7A:
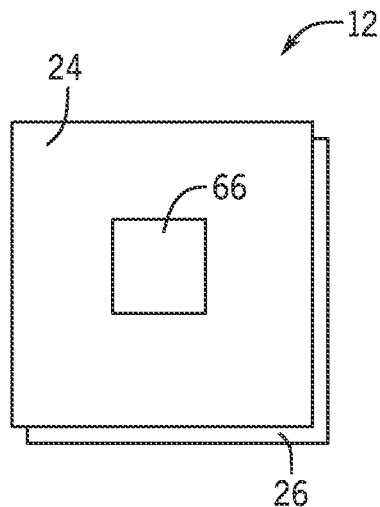
FIGS. 7A and 7B are top views of a synthetic jet according to embodiments of the invention.
Figure 7B:
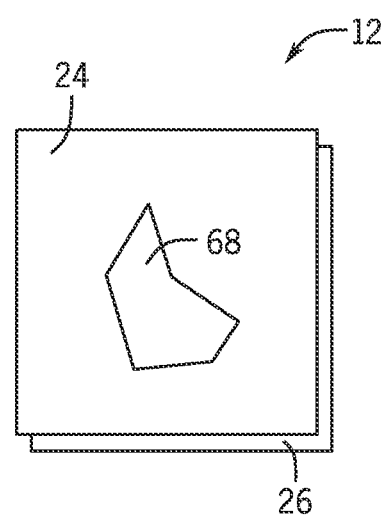

Referring next to FIGS. 7A and 7B, according to another embodiment, the shape of one or more piezo-actuators in synthetic jet 12 is altered as compared to the "standard" actuators 34, 36 shown in FIGS. 1-4. The piezo-actuator(s) on plates 24,26 can be formed to have any of a number of desired shapes based on desired or preferred operating conditions of the synthetic jet 12 (e.g., a desired modal shape of the moving components of the synthetic jet 12), with the specific shape of the piezo-actuators serving to reduce stiffness at a desired location or along a desired direction, and thus provides a lower resonance so as to lower acoustic levels of the synthetic jet 12 during operation. As one example, a piezo-actuator 66 may be constructed to have a square configuration, as shown in FIG. 7A. As another example, a piezo-actuator 68 may be constructed to have an irregular configuration, as shown in FIG. 7B.

Figure 8:
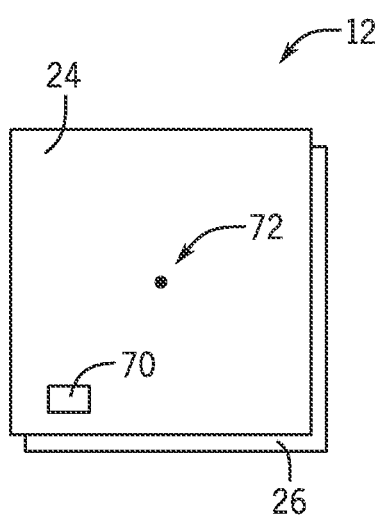
FIG. 8 is a top view of a synthetic jet according to an embodiment of the invention.

Referring next to FIG. 8, according to another embodiment, a piezo-actuator 70 can be positioned off-center (away from a center point 72) on one or both of plates 24, 26 at a desired location. The locating of piezo-actuator 70 off-center on one plates 24, 26 allows for placement/positioning of a tab or other retainment structure (not shown) in the center of plates 24, 26. Additionally, the locating of piezo-actuator 70 off-center on plates 24, 26 allows for the stiffness of the synthetic jet 12 to be minimized at a certain location and/or along a certain direction.

Figure 9:
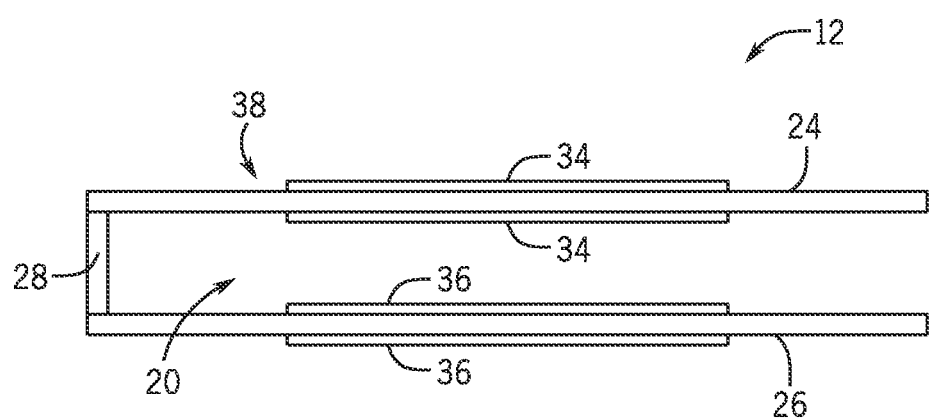
FIG. 9 is a cross-section of a synthetic jet according to an embodiment of the invention.

Referring next to FIG. 9, according to another embodiment, the synthetic jet 12 includes a "dual" arrangement of piezo-actuators 34, 36 on each plate 24, 26. That is, a piezo-actuator 34, 36 (that may be similar to the "standard" actuators 34, 36 shown in FIGS. 1-4, for example) is positioned on both the top and bottom surfaces of each plate 24, 26. The piezo-actuators 34, 36 on each plate 24, 26 are aligned with one another so as to be adjacent each other on opposing surfaces of the plate. By including a piezo-actuator 34, 36 on each of the top surface and bottom surface of the plates 24, 26, the stiffness of the synthetic jet 12 (i.e., of the diaphragms 38, 40 formed by the piezo-acuators 34, 36 and plates 24, 26) can be altered a desired amount based on desired or preferred operating conditions of the synthetic jet 12, including producing a desired modal shape of the moving components of the synthetic jet 12.

According to another embodiment of the invention, in order to reduce or increase the mechanical structure resonance of a synthetic jet device—including varying the range of motion of the plates 24, 26 and/or the frequency of the synthetic jet 12—the plates 24, 26 are altered in some form to alter the mechanical structure resonance. In altering the structure of plates 24, 26, selective/localized increasing or decreasing of the stiffness of the plates 24, 26 (as compared to a stiffness of a remainder of the plates) may be performed in order to achieve the altering of the mechanical structure resonance. Some examples of stiffening features for the plates 24, 26 include a local boss, stamped profile, stamped pattern, increased local thickness, increased local stiffer material properties and/or a corrugated shape. Examples of features that reduce the stiffness of the plates 24, 26 include local notching, scratching, reduced thickness, pre-stressing, and/or reduced local weaker material properties.

Figure 10A:
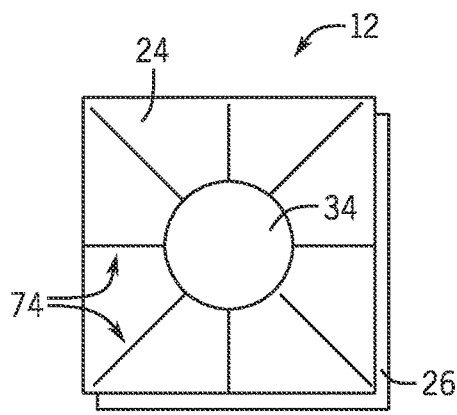
FIGS. 10A-10D are top views of a synthetic jet according to embodiments of the invention.
Figure 10B:
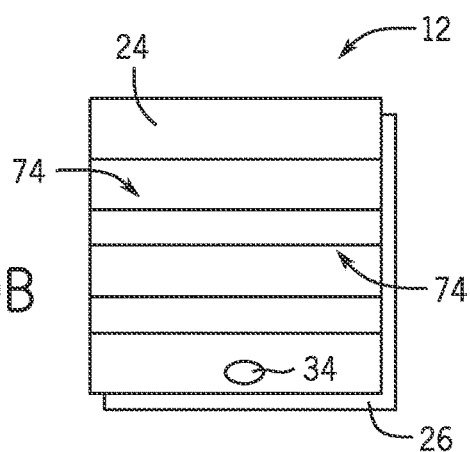
Figure 10C:
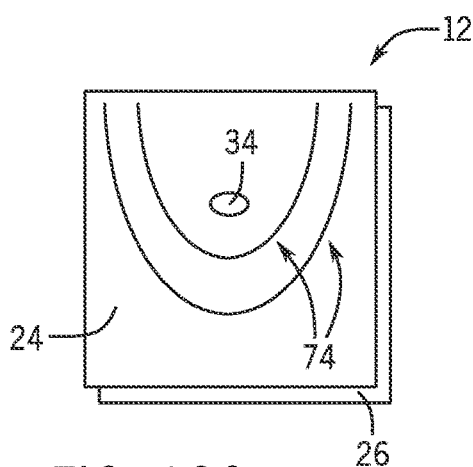
Figure 10D:
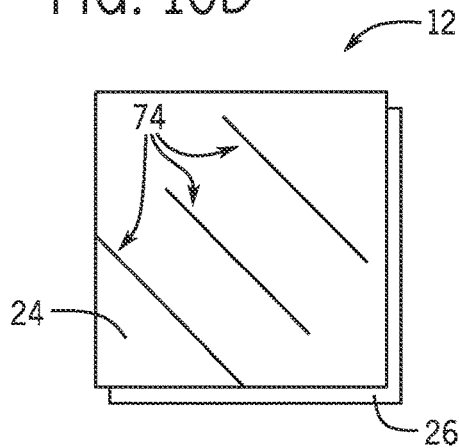
Figure 11:
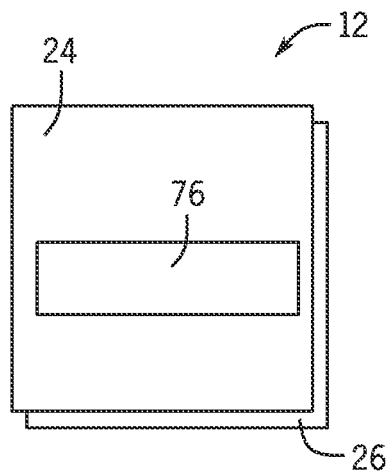
FIG. 11 is a top view of a synthetic jet according to an embodiment of the invention.

Various embodiments of the invention regarding the local increasing or decreasing of the stiffness of the plates 24, 26 are shown in FIGS. 10-11. These embodiments represent some examples, but are merely exemplary of the concepts embodied in each.

Referring first to FIGS. 10A-10D, according to one embodiment, notches or scratches 74 are formed on the plates 24, 26 to locally reduce the stiffness of the plates in order to lower the mechanical structure resonance of the synthetic jet 12. The notches/scratches 74 can be formed to have any of a number of desired patterns based on desired or preferred operating conditions of the synthetic jet 12 (e.g., a desired modal shape of the moving components of the synthetic jet 12), with the specific shape and number of the notches/scratches 74 serving to reduce a thickness of the plates 24, 26 and thereby lower stiffness at a desired location or along a desired direction. The notches/scratches 74 thus provide a lower resonance that lowers acoustic levels of the synthetic jet 12 during operation. For example, notches/scratches 74 may be formed on plates 24, 26 in a radial pattern about the piezo-actuator 34 (FIG. 10A), in a linear pattern across plates 24, 26 (FIG. 10B), in a curved pattern on plates 24, 26 (FIG. 10C), or in a random pattern on plates 24, 26 (FIG. 10D).

According to another embodiment, the stiffness of the plates 24, 26 can also be reduced via creation of a pre-stress on the plates. As is known, buckling of structures occurs when the stiffness of a structure is reduced to zero due to an applied load, and thus the term "pre-buckled" as used herein is understood to refer to the plates 24, 26 being in a state that has a stiffness that is lower than the nominal stiffness, and thus a lower natural frequency. The pre-stress to create a pre-buckled state of lowered stiffness can be implemented using a clamp, a spring with an initial stretch, or by the thermal expansion mismatch of different materials. The pre-buckled plate thus is understood to have a locally reduced stiffness by way of the pre-stress.

Referring next to FIG. 11, according to one embodiment, a stiffening feature 76 is formed on the plates 24, 26 to locally increase the stiffness of the plates in order to alter the mechanical structure resonance of the synthetic jet. The stiffening feature 76 may be formed as a local boss, stamped feature, area of increased thickness, or a local area formed of a material having stiffer material properties, that is formed on the plates 24, 26, with the specific construction of the stiffening feature 76 being based on desired or preferred operating conditions of the synthetic jet 12 and in order to control the modal shape of the synthetic jet 12 (i.e., of the moving components therein) such that it provides a desired flow output and/or has desired frequency characteristics during operation.

Figure 12:
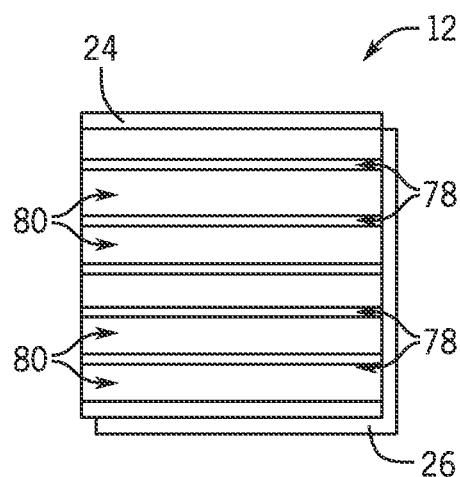
FIG. 12 is a top view of a synthetic jet according to an embodiment of the invention.

Referring next to FIG. 12, according to one embodiment, the plates 24, 26 are formed as corrugated plates that locally increase the stiffness of the plates in order to alter the mechanical structure resonance of the synthetic jet. The corrugated plates include a series of parallel ridges 78 and furrows 80 that stiffen the plates 24, 26 and in order to alter the mechanical resonance of the synthetic jet. While the entirety of the plates 24, 26 are shown in FIG. 12 as having a corrugated construction, it is recognized that only portions of the plates could have a corrugated construction, with a remainder of the plates having a flat/planar construction. In operation of the synthetic jet 12, the corrugated plates (with features 78, 80) affect the modal shape of the synthetic jet 12 such that it provides a desired flow output and/or has desired frequency characteristics during operation.

According to embodiments of the invention, it is recognized that the features described above and illustrated in FIGS. 10-12 that are employed to achieve selective local increasing or decreasing of the stiffness of the plates could be applied in singularity or in combination in a desired pattern. It is further recognized that—in addition to the features employed to achieve selective local increasing or decreasing of the stiffness of the plates—the plates 24, 26 may have a varied shape (beyond a standard squire or circular shape, for example) that is selected to further affect the mechanical structure resonance of the synthetic jet 12. Still further, it is recognized that the features illustrated in FIGS. 10-12 that are employed to achieve selective local increasing or decreasing of the stiffness of the plates 24, 26 could be used in combination with variations regarding the size, shape and/or number of piezo-actuator device(s) on the plates 24, 26 that are shown in FIGS. 5-9.

Beneficially, embodiments of the invention thus provide a lower acoustic signature synthetic jet. A synthetic jet provided having plates and piezo-actuators of a desired, size, number, shape and/or construction that serve to reduce or increase the mechanical structure resonance of the synthetic jet by a desired amount. The selective altering of the mechanical structure resonance of the synthetic jet allows for designing of a synthetic jet having a desired mechanical resonance mode in a low human receptive band such as, but not limited to, below 300 Hz or above 20 kHz, so as to reduce the acoustic signature of the synthetic jet.

Therefore, according to one embodiment of the invention, a synthetic jet device includes a first plate, a second plate spaced apart from the first plate, a spacing component coupled to and positioned between the first and second plates to form a chamber and including an orifice therein, and an actuator element coupled to at least one of the first and second plates to selectively cause deflection thereof, thereby changing a volume within the chamber so that a series of fluid vortices is generated and projected out from the orifice of the spacing component. At least one of the first and second plates includes a modified section that alters a mechanical resonance of the synthetic jet device, so as to control a level of acoustic noise generated by the synthetic jet device.

According to another aspect of the invention, a synthetic jet device includes a first plate, a second plate spaced apart from the first plate, a spacing component coupled to and positioned between the first and second plates to form a chamber and including an orifice therein, and an actuator element coupled to at least one of the first and second plates to selectively cause deflection thereof, thereby changing a volume within the chamber so that a series of fluid vortices is generated and projected out from the orifice of the spacing component, wherein at least one of the actuator element, the first plates, and the second plate is constructed to cause a mechanical resonance of the synthetic jet device during operation to be outside of a human audible frequency range.

According to yet another aspect of the invention, a synthetic jet device includes a first plate, a second plate spaced apart from the first plate, a spacing component coupled to and positioned between the first and second plates to form a chamber and including an orifice therein, and a piezomotive actuator coupled to at least one of the first and second plates to selectively cause deflection thereof, thereby changing a volume within the chamber so that a fluid flow is generated and projected from the orifice of the spacing component, wherein the piezomotive actuator is constructed to cause the synthetic jet device to operate within a desired mechanical resonance range that is predetermined.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A synthetic jet device comprising:
a first plate;
a second plate spaced apart from the first plate;
a spacing component coupled to and positioned between the first and second plates to form a chamber and including an orifice therein; and
an actuator element coupled to at least one of the first and second plates to selectively cause deflection thereof, thereby changing a volume within the chamber so that a series of fluid vortices is generated and projected out from the orifice of the spacing component;
wherein at least one of the first and second plates includes a modified section that alters a mechanical resonance of the synthetic jet device, so as to control a level of acoustic noise generated by the synthetic jet device; and
wherein the modified section is formed as part of a surface of the at least one of the first and second plates to which the actuator element is coupled or on a surface of the at least one of the first and second plates that is opposite from the surface to which the actuator element is coupled, with the modified section on the surface differing from a non-modified remainder of that surface.

2. The synthetic jet device of claim 1 wherein the modified section has one of an increased stiffness or a reduced stiffness as compared to a remaining portion of the plate.

3. The synthetic jet device of claim 2 wherein the modified section comprises an arrangement of notches or scratches formed in least one of the first and second plates, with the arrangement of notches or scratches providing a section of reduced plate thickness.

4. The synthetic jet device of claim 2 wherein the modified section comprises a section in at least one of the first and second plates that is composed of a material having weaker material properties as compared to a material used to form a remainder of the first and second plates.

5. The synthetic jet device of claim 2 wherein the modified section comprises a pre-buckled plate.

6. The synthetic jet device of claim 2 wherein the modified section comprises one of a local boss, a stamped feature, and an area of increased thickness.

7. The synthetic jet device of claim 2 wherein the modified section comprises a section in at least one of the first and second plates that is composed of a material having stiffer material properties as compared to a material used to form a remainder of the first and second plates.

8. The synthetic jet device of claim 2 wherein the modified section comprises a plate section having a corrugated construction.

9. The synthetic jet device of claim 1 wherein the modified section is constructed to cause a mechanical resonance of the synthetic jet device during operation to be below 30 Hz or above 20 kHz.

10. A synthetic jet device comprising:
a first plate;
a second plate spaced apart from the first plate;
a spacing component coupled to and positioned between the first and second plates to form a chamber and including an orifice therein; and
an actuator element coupled to at least one of the first and second plates to selectively cause deflection thereof, thereby changing a volume within the chamber so that a series of fluid vortices is generated and projected out from the orifice of the spacing component;
wherein at least one of the first and second plates is constructed to cause a mechanical resonance of the synthetic jet device during operation to be outside of the human audible frequency range; and
wherein the at least one of the first and second plates includes a section having a lower stiffness as compared to a stiffness of a remainder of the plate, the section having the lower stiffness comprising one or more of:
an arrangement of notches or scratches formed in least one of the first and second plates;
a section in at least one of the first and second plates that is composed of a material having reduced stiffness properties as compared to a material used to form a remainder of the first and second plates; and
a pre-buckled plate.

* * * * *